United States Patent
Tian

(10) Patent No.: US 10,461,240 B2
(45) Date of Patent: Oct. 29, 2019

(54) PIEZOELECTRIC SENSORS AND METHODS FOR MANUFACTURING THE SAME

(71) Applicant: BOE TECHNOLOGY GROUP CO., LTD., Beijing (CN)

(72) Inventor: Xueyan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 142 days.

(21) Appl. No.: 15/567,965

(22) PCT Filed: Mar. 22, 2017

(86) PCT No.: PCT/CN2017/077671
§ 371 (c)(1),
(2) Date: Oct. 19, 2017

(87) PCT Pub. No.: WO2017/193708
PCT Pub. Date: Nov. 16, 2017

(65) Prior Publication Data
US 2018/0219151 A1    Aug. 2, 2018

(30) Foreign Application Priority Data

May 12, 2016  (CN) .......................... 2016 1 0317296

(51) Int. Cl.
*H01L 41/107* (2006.01)
*H01L 41/04* (2006.01)
(Continued)

(52) U.S. Cl.
CPC ............ *H01L 41/1132* (2013.01); *G01L 1/16* (2013.01); *H01L 41/0471* (2013.01);
(Continued)

(58) Field of Classification Search
CPC ............. H01L 41/1132; H01L 41/0471; H01L 41/081; H01L 41/193; H01L 41/27;
(Continued)

(56) References Cited

U.S. PATENT DOCUMENTS

2005/0193822 A1* 9/2005 Amano ...................... G01L 1/16
73/704
2017/0194427 A1* 7/2017 Tian ....................... H01L 29/786
(Continued)

FOREIGN PATENT DOCUMENTS

CN         104523285 A        4/2015
CN         104613861 A        5/2015
(Continued)

OTHER PUBLICATIONS

International Search Report and Written Opinion dated Jun. 28, 2017, for corresponding PCT Application No. PCT/CN2017/077671.
(Continued)

Primary Examiner — Thomas M Dougherty
(74) Attorney, Agent, or Firm — Kinney & Lange, P.A.

(57) ABSTRACT

The present disclosure discloses a piezoelectric sensor and a method for manufacturing the same to realize omni-directional pressure sensing. The piezoelectric sensor according to the present disclosure comprises a first electrode layer, a second electrode layer and a piezoelectric thin film layer between the first electrode layer and the second electrode layer, the piezoelectric sensor further comprising: a first functional module and a second functional module, both of which are connected to the second electrode layer, wherein the first functional module is configured to sense a pressure applied to the piezoelectric sensor in a first direction, and the second functional module is configured to sense a pressure applied to the piezoelectric sensor in a second direction, the
(Continued)

first direction and the second direction are perpendicular to each other.

20 Claims, 4 Drawing Sheets

(51) Int. Cl.
| | | |
|---|---|---|
| H01L 41/113 | (2006.01) | |
| G01L 1/16 | (2006.01) | |
| H01L 41/047 | (2006.01) | |
| H01L 41/193 | (2006.01) | |
| H01L 41/27 | (2013.01) | |
| H01L 51/05 | (2006.01) | |
| H01L 41/08 | (2006.01) | |
| H01L 41/311 | (2013.01) | |
| H01L 51/00 | (2006.01) | |
| H01L 51/10 | (2006.01) | |

(52) U.S. Cl.
CPC .......... *H01L 41/081* (2013.01); *H01L 41/193* (2013.01); *H01L 41/27* (2013.01); *H01L 41/311* (2013.01); *H01L 51/0048* (2013.01); *H01L 51/0508* (2013.01); *H01L 51/0558* (2013.01); *H01L 51/105* (2013.01)

(58) Field of Classification Search
CPC ............... H01L 41/311; H01L 51/0048; H01L 51/0508; H01L 51/0558; H01L 51/105; G01L 1/16

USPC .......................................... 310/317–319, 338
See application file for complete search history.

(56) References Cited

U.S. PATENT DOCUMENTS

| | | | | |
|---|---|---|---|---|
| 2018/0114931 | A1* | 4/2018 | Tian | .......................... G01L 1/16 |
| 2019/0058106 | A1* | 2/2019 | Meng | .................. H01L 41/1132 |

FOREIGN PATENT DOCUMENTS

| | | | | |
|---|---|---|---|---|
| CN | 104655000 A | | 5/2015 | |
| CN | 105203019 A | | 12/2015 | |
| CN | 105428401 A | | 3/2016 | |
| CN | 105841850 A | | 8/2016 | |
| CN | 205620053 U | | 10/2016 | |
| EP | 3217167 A1 | * | 9/2017 | ............. G01N 27/12 |
| JP | 09203671 A | | 8/1997 | |

OTHER PUBLICATIONS

Chinese Office Action dated Jul. 4, 2017, for corresponding Chinese Application No. 201610317296.9.

English translation of International Search Report and Written Opinion dated Jan. 28, 2017, for corresponding PCT Application No. PCT/CN2017/077671.

* cited by examiner (a)

(b)

PIEZOELECTRIC SENSORS AND METHODS FOR MANUFACTURING THE SAME

CROSS-REFERENCE TO RELATED APPLICATION(S)

The present application is the national phase of PCT Application No. PCT/CN2017/077671 filed Mar. 22, 2017, which in turn claims priority to the Chinese Patent Application No. 201610317296.9, filed on May 12, 2016, entitled "PIEZOELECTRIC SENSORS AND METHODS FOR MANUFACTURING THE SAME," both of which are incorporated herein by reference in its entirety.

TECHNICAL FIELD

The present disclosure relates to the field of sensor technology, and more particularly, to a piezoelectric sensor and a method for manufacturing the same.

BACKGROUND

Silicon electronic devices are the most important category of devices in the microelectronics science and technology, and have played an important role in the development of science and technology in the last century. Carbon-based electronic devices have shown a great technical potential since the beginning of this century. Especially, carbon nanotubes integrate a variety of physical and chemical properties due to good electrical, optical and mechanical properties thereof. Currently, for medical and wearable devices such as medical sensors, electronic skin etc., the carbon nanotubes have been used as candidates for research on full flexible Carbon Nanotube Thin Film Transistors (CNT-TFTs).

Piezoelectric sensors are a category of sensors developed based on piezoelectric effect dielectric. The so-called piezoelectric effect refers to that when some dielectric is deformed as an external force is applied in a certain direction, a polarization phenomenon may occur in the dielectric, and at the same time opposite charges, i.e., positive and negative charges, appear in two opposite surfaces of the dielectric. After the external force is removed, the dielectric will return to an uncharged state. This phenomenon is called a direct piezoelectric effect. When the direction of the applied force changes, the polarity of the charges will change accordingly. On the contrary, when an electric field is applied in a polarization direction of the dielectric, the dielectric may be deformed, and after the electric field is removed, the deformation of the dielectric disappears. This phenomenon is called an inverse piezoelectric effect.

For conventional piezoelectric sensors, all the thin films associated with sensor components are manufactured on a silicon chip. When a piezoelectric thin film layer is manufactured using the silicon chip, an oven annealing process is implemented at a high temperature of 600° C.-700° C., and remaining related integrated circuits are manufactured using conventional semiconductor processes. However, such processes can only result in rigid piezoelectric sensor components, and these piezoelectric sensors are limited to unidirectional pressure sensing.

In conclusion, the conventional piezoelectric sensors can only realize unidirectional pressure sensing, but cannot realize omni-directional pressure sensing.

SUMMARY

The embodiments of the present disclosure provide a piezoelectric sensor and a method for manufacturing the same, so as to realize omni-directional pressure sensing.

A piezoelectric sensor according to the embodiments of the present disclosure comprises a first electrode layer, a second electrode layer and a piezoelectric thin film layer between the first electrode layer and the second electrode layer, the piezoelectric sensor further comprising: a first functional module and a second functional module, both of which are connected to the second electrode layer, wherein the first functional module is configured to sense a pressure applied to the piezoelectric sensor in a first direction, and the second functional module is configured to sense a pressure applied to the piezoelectric sensor in a second direction, the first direction and the second direction are perpendicular to each other.

In the piezoelectric sensor according to the embodiments of the present disclosure, the first functional module configured to sense a pressure in a first direction and the second functional module configured to sense a pressure in a second direction are connected to the second electrode layer in the piezoelectric sensor respectively, so that when the piezoelectric sensor is applied with pressures in different directions, pressure changes in different directions can be sensed by different functional modules to realize omni-directional pressure sensing.

In an embodiment, the first functional module comprises a first Thin Film Transistor (TFT) having a source connected to a first electrode contact terminal of the second electrode layer, a drain connected to a first data line and a gate connected to a first gate line; and the second functional module comprises a second TFT having a source connected to a second electrode contact terminal of the second electrode layer, a drain connected to a second data line and a gate connected to a second gate line, wherein the first TFT is a P-type TFT, and the second TFT is an N-type TFT.

In an embodiment, the first TFT and the second TFT share a same layer of carbon nanotube thin film as a conductive channel layer.

Using the same layer of carbon nanotube thin film as the conductive channel layer shared by the first TFT and the second TFT enables a simple manufacturing process. Further, since the carbon nanotube has characteristics such as excellent flexibility, excellent photo-electricity, high stability etc., the TFTs made of the carbon nanotube thin film can achieve better electrical characteristics.

In an embodiment, a work function of a first metal forming the source and the drain of the first TFT is greater than a work function of a second metal forming the source and the drain of the second TFT.

Since barriers for carriers formed by contact between the metal with different work functions and the carbon nanotube thin film are different, different conductive types (i.e., P-type and N-type) of TFTs can be turned on due to the charges induced by the second electrode layer of the piezoelectric sensor under pressures in different directions, and thereby the pressure sensing in the corresponding directions is realized by the TFTs.

In an embodiment, the source and the drain of the first TFT and the source and the drain of the second TFT are in contact with the carbon nanotube thin film; a gap between the Fermi energy level of the first metal and a valence band of the carbon nanotube thin film is less than a gap between the Fermi energy level of the first metal and a conduction band of the carbon nanotube thin film; and a gap between the Fermi energy level of the second metal and a conduction band of the carbon nanotube thin film is less than a gap between the Fermi energy level of the second metal and a valence band of the carbon nanotube thin film.

In an embodiment, the first metal is palladium (Pd) and the second metal is scandium (Sc).

In an embodiment, the bottom of the first metal Pd forming the source and the drain of the first TFT further comprises metal Titanium (Ti).

Thereby, the adhesion and wettability of the metal on the carbon nanotube thin film is improved.

In an embodiment, the metal Ti has a thickness ranging from 0.2 nm to 0.8 nm.

In an embodiment, the piezoelectric thin film layer accumulates positive charges on the second electrode layer when the piezoelectric sensor is applied with the pressure in the first direction, and accumulates negative charges on the second electrode layer when the piezoelectric sensor is applied with the pressure in the second direction.

In an embodiment, the piezoelectric sensor further comprises a silk fibroin substrate, on which all of the second electrode layer, the first functional module and the second functional module are located.

Since silk fibroin has good biocompatibility and excellent mechanical properties, a flexible piezoelectric sensor can be manufactured.

A method for manufacturing a piezoelectric sensor according to the embodiments of the present disclosure comprises:

sequentially manufacturing a second electrode layer, a piezoelectric thin film layer and a first electrode layer on the substrate from bottom to up; and manufacturing a first functional module and a second functional module on the substrate, wherein both of the first functional module and the second functional module are manufactured to be connected to the second electrode layer, the first functional module is configured to sense a pressure applied to the piezoelectric sensor in a first direction, the second functional module is configured to sense a pressure applied to the piezoelectric sensor in a second direction, the first direction and the second direction are perpendicular to each other.

In an embodiment, the second electrode layer, the piezoelectric thin film layer and the first electrode layer are sequentially manufactured on the substrate from bottom to top using an electron beam thermal evaporation method.

In an embodiment, the first functional module comprises a first Thin Film Transistor (TFT), and the second functional module comprises a second TFT, and the step of manufacturing the first functional module and the second functional module on the substrate further comprises:

manufacturing the first TFT on the substrate, manufacturing the second TFT on the substrate, electrically connecting a source of the first TFT to a first electrode contact terminal pre-provided on the second electrode layer, and electrically connecting a source of the second TFT to a second electrode contact terminal pre-provided on the second electrode layer, wherein the first TFT is a P-type TFT and the second TFT is an N-type TFT.

In an embodiment, a same layer of carbon nanotube thin film is shared by the first TFT and the second TFT as a conductive channel layer.

In an embodiment, the carbon nanotube thin film is manufactured using a solution approach.

In an embodiment, the source and a drain of the first TFT are manufactured using first metal, and the source and a drain of the second TFT are manufactured using second metal, wherein a work function of the first metal is greater than a work function of the second metal.

In an embodiment, the first metal is Palladium (Pd), and the second metal is Scandium (Sc).

In an embodiment, the first metal and the second metal are manufactured using an electron beam thermal evaporation method.

In an embodiment, the substrate is a silk fibroin substrate, which is manufactured using a solution approach.

In an embodiment, the silk fibroin substrate is manufactured on solid Polydimethylsiloxane (PDMS) using a solution approach, and after the step of manufacturing the first functional module and the second functional module, the method further comprises: peeling the PMDS off.

DETAILED DESCRIPTION

Figure 1:
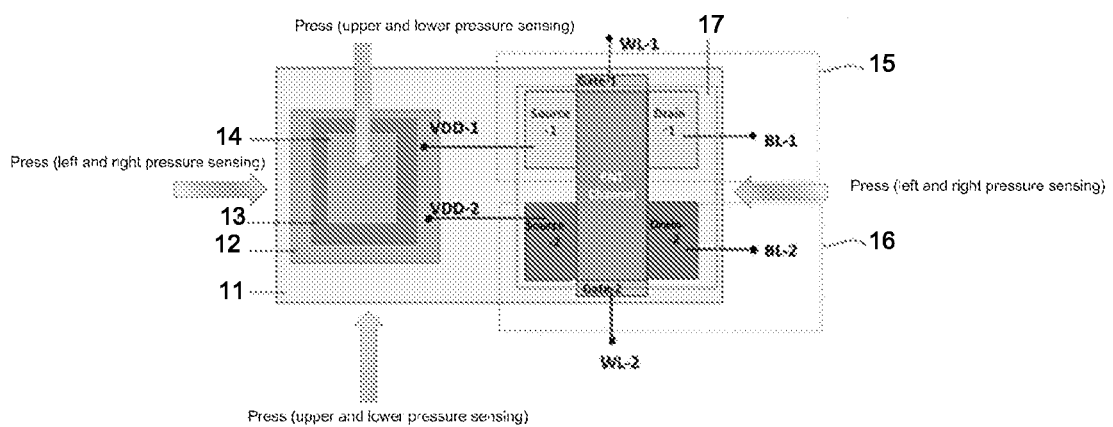
FIG. 1 is a structural diagram of a piezoelectric sensor according to an embodiment of the present disclosure.

The embodiments of the present disclosure provide a piezoelectric sensor and a method for manufacturing the same, to realize omni-directional pressure sensing.

The technical solutions in the embodiments of the present disclosure will be described clearly and completely below in conjunction with the accompanying drawings in the embodiments of present disclosure, and it will be apparent that the described embodiments are merely a part of the embodiments of the present disclosure instead of all the embodiments. All other embodiments obtained by those of ordinary skill in the art based on the embodiments of the present disclosure without making any creative work are within the protection scope of the present disclosure.

The piezoelectric sensor according to the embodiments of the present disclosure comprises a first electrode layer, a second electrode layer and a piezoelectric thin film layer between the first electrode layer and the second electrode layer, and the piezoelectric sensor further comprises a first functional module configured to sense a pressure in a first direction and a second functional module configured to sense a pressure in a second direction, wherein the first functional module and the second functional module are connected to the second electrode layer respectively, and the first direction and the second direction are perpendicular to each other.

The first direction may be, for example, a vertical direction, and the second direction may be, for example, a horizontal direction. The first electrode layer may be, for example, an upper electrode layer, and the second electrode layer may be, for example, a lower electrode layer.

As an implementation, the first functional module may comprise a first TFT having a source connected to a first electrode contact terminal of the second electrode layer, a drain connected to a first data line and a gate connected to a first gate line; and the second functional module may comprise a second TFT having a source connected to a second electrode contact terminal of the second electrode layer, a drain connected to a second data line and a gate connected to a second gate line, wherein the first TFT is a P-type TFT, and the second TFT is an N-type TFT.

In this way, after the piezoelectric thin film layer in the piezoelectric sensor is applied with a pressure in a direction, opposite charges, i.e., positive and negative charges, may be generated on the first electrode layer and the second electrode layer, and as the direction of the applied pressure changes, positive and negative signs of the charges generated on the second electrode layer will change accordingly, so that a corresponding conductive type (P-type or N-type) of TFT may be turned on to operate according to the change of the positive and negative charges on the second electrode layer. Thereby, a pressure in a corresponding direction may be sensed by a TFT in an operating state.

In an embodiment, the first TFT and the second TFT share a same layer of carbon nanotube thin film as a conductive channel layer.

In an embodiment, when the first TFT is a P-type TFT and the second TFT is an N-type TFT, a work function of first metal forming the source and the drain of the first TFT is greater than a work function of second metal forming the source and the drain of the second TFT.

When different kinds of metal with different work functions are used as the source and the drain, barriers for carriers formed by contact between the different kinds of metal with different work functions and the conductive channel layer are different, for example, an electron barrier or a hole barrier may be formed. The electron barrier has a significant blocking effect for electrons, and the hole barrier has a significant blocking effect for holes. As a result, different conductive types (i.e., P-type and N-type) of TFTs can be turned on by charges induced by the second electrode layer of the piezoelectric sensor under pressures in different directions, and thereby the pressure sensing in the different directions can be realized by the TFTs.

In an embodiment, the source and the drain of the first TFT and the source and the drain of the second TFT are in contact with the carbon nanotube thin film; a gap between the Fermi energy level of the first metal and a valence band of the carbon nanotube thin film is less than a gap between the Fermi energy level of the first metal and a conduction band of the carbon nanotube thin film; and a gap between the Fermi energy level of the second metal and a conduction band of the carbon nanotube thin film is less than a gap between the Fermi energy level of the second metal and a valence band of the carbon nanotube thin film.

For example, the first TFT is a P-type TFT, the second TFT is an N-type TFT, both of the source and the drain of the first TFT are metal Palladium (Pd), a work function of which is 5.1 eV, both of the source of the drain of the second TFT are metal Scandium (Sc), a work function of which 3.3 eV, the first TFT and the second TFT share a same layer of carbon nanotube thin film as a conductive channel layer, and an intrinsic carbon nanotube has the Fermi energy level of 4.5 eV. In addition, a gap between the Fermi energy level of the metal Pd and the valence band of the carbon nanotube is less than a gap between the Fermi energy level of the metal Pd and the conduction band of the carbon nanotube, that is, the Fermi energy level of the metal Pd is closer to the valence band of the carbon nanotube. Therefore, when the metal Pd is in contact with the carbon nanotube, an electron barrier is formed at a position where the metal Pd is in contact with the carbon nanotube. The electron barrier has a significant blocking effect for electrons and has a weak blocking effect for holes. In this case, after the piezoelectric thin film layer is applied with a pressure in a first direction, if the charges accumulated on the second electrode layer are positive charges (which may be considered as holes), the positive charges may be easily injected into the carbon nanotube through the source formed of the metal Pd, which are then formed as a hole current in the first TFT to turn on the first TFT. A gap between the Fermi energy level of the metal Sc and the conduction band of the carbon nanotube is less than the gap between the Fermi energy level of the metal Sc and the valence band of the carbon nanotube, that is, the Fermi energy level of the metal Sc is closer to the conduction band of the carbon nanotube. Therefore, when the metal Sc is in contact with the carbon nanotube, a hole barrier is formed at a position where the metal Sc is in contact with the carbon nanotube. The hole barrier has a significant blocking effect for holes and has a weak blocking effect for electrons. In this case, after the piezoelectric thin film layer is applied with a pressure in a second direction, if the charges accumulated on the second electrode layer are negative charges (which may be considered as electrons), the negative charges may be easily injected into the carbon nanotube through the source formed of the metal Sc, which are then formed as an electron current in the second TFT to turn on the second TFT.

In an embodiment, the piezoelectric sensor further comprises a silk fibroin substrate, on which all of the second electrode layer, the first functional module and the second functional module are located.

As an implementation, a structure of the piezoelectric sensor according to the embodiment of the present disclosure is shown in FIG. 1. The piezoelectric sensor comprises a silk fibroin substrate 11, and a second electrode layer 12, a piezoelectric thin film layer 13, a first electrode layer 14, a first TFT 15 and a second TFT 16 on the silk fibroin substrate 11. The first TFT 15 is a P-type TFT having a source which is denoted as Source-1 in the figure to be distinguished from a source of the second TFT 16; a drain which is denoted as Drain-1 in the figure to be distinguished from a drain of the second TFT 16; a gate which is denoted as Gate-1 in the figure to be distinguished from a gate of the second TFT 16; a Carbon Nanotube (CNT) conductive channel layer, which is shared with the second TFT 16; and a Gate Insulating (GI) layer 17 which is shared with the second TFT 16. The second TFT 16 is an N-type TFT having a source which is denoted as Source-2 in the figure; a drain which is denoted as Drain-2 in the figure; a gate which is denoted as Gate-2 in the figure; the CNT conductive channel layer which is shared with the first TFT 15; and the gate insulating layer 17 which is shared with the first TFT 15.

The Source-1 is connected to an electrode contact terminal of the second electrode layer 12, which supplies a negative supply voltage (VDD-1) to the Source-1, the Drain-1 is connected to a first data line (BL-1), and the Gate-1 is connected to a first gate line (WL-1); and the Source-2 is connected to another electrode contact terminal of the second electrode layer 12, which supplies a positive supply voltage (VDD-2) to the Source-2, the Drain-2 is connected to a second data line (BL-2), and the Gate-2 is connected to a second gate line (WL-2).

Figure 2:
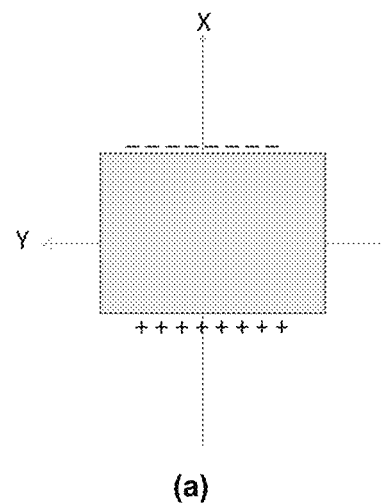
FIG. 2 is a diagram of charge variation in a first electrode layer and a second electrode layer of a piezoelectric sensor when the piezoelectric sensor is applied with pressures in different directions according to an embodiment of the present disclosure.
Figure 2:
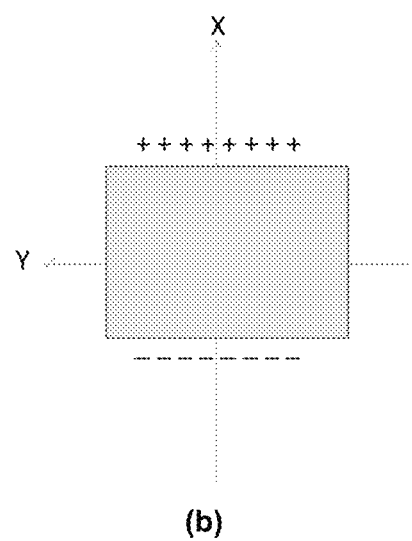

FIG. 2 is a diagram of charge variation in a first electrode layer 14 and a second electrode layer 12 of a piezoelectric sensor when the piezoelectric sensor is applied with pressures in different directions according to an embodiment of the present disclosure.

When the piezoelectric sensor according to the embodiment of the present disclosure is applied with pressures in different directions, crystals in the piezoelectric thin film layer 13 may produce compressive deformation, and relative positions of positive and negative ions change therewith as follows:

when the piezoelectric sensor is applied with a pressure in the vertical direction, positive charges are accumulated on the second electrode layer 12, and negative charges are accumulated on the first electrode layer 14, as shown in (a) of FIG. 2; and when the piezoelectric sensor is applied with a pressure in the horizontal direction, negative charges are accumulated on the second electrode layer 12, and positive charges are accumulated on the first electrode layer 14, as shown in (b) of FIG. 2.

Figure 3:
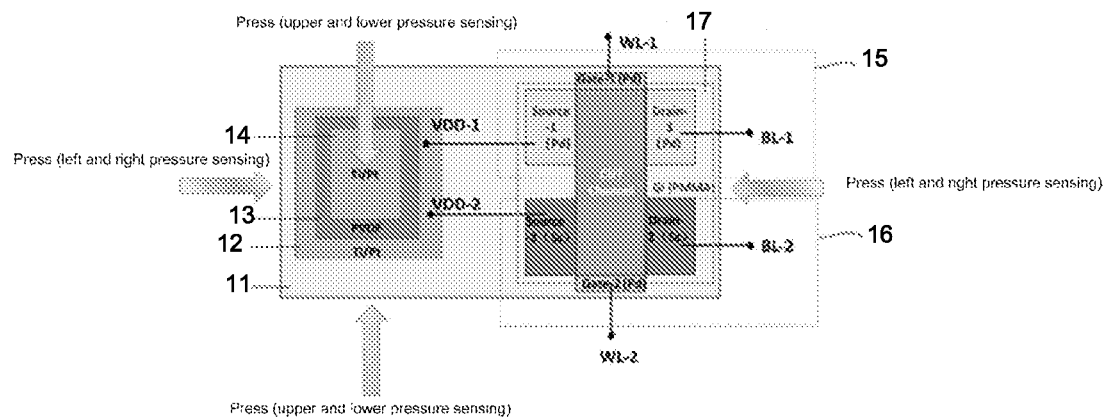
FIG. 3 is a diagram of material composition of a piezoelectric sensor according to an embodiment of the present disclosure.

FIG. 3 is a diagram of material composition of a piezoelectric sensor according to an embodiment of the present disclosure.

Materials selected for various parts of the piezoelectric sensor according to the embodiment of the present disclosure are shown in FIG. 3 and are as follows.

The substrate 11 of the piezoelectric sensor is a silk fibroin substrate, i.e., silk fibroin is selected as the material of the substrate 11. The silk fibroin is natural polymer fibroin extracted from silk, which has good biocompatibility and excellent mechanical properties, can be processed differently to be in different forms, such as solution, film and gel etc. The silk fibroin, which is used as the substrate of the piezoelectric sensor, may be manufactured as a full flexible piezoelectric thin film sensor.

Metal palladium (Pt) or Titanium (Ti) is selected as the material of the second electrode layer 12 and the first electrode layer 14 on the silk fibroin substrate 11, and Polyvinylidene Fluoride (PVDF) is selected as the material of the piezoelectric thin film 13 between the second electrode layer 12 and the first electrode layer 14. The PVDF is an organic piezoelectric material, which has a strong piezoelectric effect, good flexibility, low density, low impedance, nontoxicity, good chemical stability, and excellent biocompatibility, and has been applied to implantable medical sensors. Of course, other materials such as Bariumz irconate Titanate (BZT) or Pb-based lanthanumdoped Zirconate Titanate (PZT) etc. may also be selected for the piezoelectric thin film layer.

The first TFT 15 and the second TFT 16 on the silk fibroin substrate 11 use a same layer of carbon nanotube thin film as a common conductive channel layer. The carbon nanotube has excellent flexibility and excellent photoelectric properties. The material of carbon nanotube becomes the leader in biological nano-materials due to its advantages such as high stability and good biocompatibility, and can be used as a basic material for the preparation of tissue engineering cell growth scaffolds, artificial blood vessels, drug carriers etc. Specifically, in the embodiment of the present disclosure, one type of material of carbon nanotubes i.e., a high-purity semiconductor category of Single-Walled Carbon Nanotube (SC-SWNT), is selected as a conductive channel layer which is shared by the first TFT 15 and the second TFT 16.

The material selected for the source (Source-1) and the drain (Drain-1) of the first TFT 15 is metal Pd with a thickness of 70 nm, and when the source and the drain are manufactured, metal Titanium (Ti) with a certain thickness is added at the bottom of the metal Pd to improve the adhesion and wettability of the metal on the carbon nanotube thin film, wherein the thickness of the metal Ti may range from 0.2 nm to 0.8 nm, and in the present embodiment, the thickness of Ti is selected to be 0.5 nm. The material selected for the gate (Gate-1) of the first TFT 15 is the metal Pd.

The material selected for the source (Source-2) and the drain (Drain-2) of the second TFT 16 is metal Sc having a thickness of 30 nm, and the material selected for the gate (Gate-2) of the second TFT 16 is the metal Pd.

The metal Ti, Pd and Pt is metallic elements with good biocompatibility.

The material selected for the Gate Insulating (GI) layer 17 which is shared by the first TFT 15 and the second TFT 16 is Polymethyl Methacrylate (PMMA).

A specific operating principle of the piezoelectric sensor shown in FIG. 3 is as follows.

When a pressure in the vertical direction (see upper and lower pressure sensing as shown in FIG. 3) is applied, holes are accumulated on the second electrode layer 12. In this case, VDD-1 is a negative voltage which may be provided as a source-drain voltage (Vds) of the first TFT 15. The material selected for the source (Source-1) and the drain (Drain-1) of the first TFT 15 is the metal Pd, and an electron barrier is formed at a position where Pd is in contact with the carbon nanotube thin film layer. The electron barrier has a significant blocking effect for electrons and has a weak blocking effect for holes. Therefore, it may be understood as that the source and drain of the first TFT 15 and the valence band of the carbon nanotube form a barrier-free contact for holes. When a negative voltage signal is input to the Gate-1, holes are accumulated in the carbon nanotube functioned as the conductive channel. As the barrier formed at a position where the source and the drain of the first TFT 15 are in contact with the carbon nanotube has a weak blocking effect for the holes, holes in the second electrode layer 12 are easily injected and are then formed as a hole current through the carbon nanotube to turn on the first P-type TFT 15 to operate, and a piezoelectric signal generated by the application of the pressure is correspondingly converted into a current signal. In this case, the material selected for the source (Source-2) and the drain (Drain-2) of the second TFT 16 is the metal Sc, and a hole carrier is formed at a position where Sc is in contact with the carbon nanotube thin film layer. The hole barrier has a significant blocking effect for holes, so that the holes in the second electrode layer 12 cannot enter the carbon nanotube through the Source-2, and therefore the second TFT 16 is in a turn-off state at this time. Thus, the pressure externally applied in the vertical direction can be sensed by the first TFT 15.

When a pressure in the horizontal direction (see left and right pressure sensing as shown in FIG. 3) is applied, electrons are accumulated on the second electrode layer 12. In this case, VDD-2 is a positive voltage which may be provided as a source-drain voltage (Vds) of the second TFT 16. The material selected for the source (Source-2) and the drain (Drain-2) of the second TFT 16 is the metal Sc, and a hole barrier is formed at a position where Sc is in contact with the carbon nanotube thin film layer. The hole barrier has a significant blocking effect for holes and has a weak blocking effect for electrons. Therefore, it may be understood as that the source and drain of the second TFT 16 and the conduction band of the carbon nanotube form a barrier-free contact for electrons. When a positive voltage signal is input to the Gate-2, electrons are accumulated in the carbon nanotube functioned as the conductive channel. As the barrier formed at a position where the source and the drain of the second TFT 16 are in contact with the carbon nanotube has a weak blocking effect for the electrons, electrons in the second electrode layer 12 are easily injected and are then formed as an electron current through the carbon nanotube to turn on the second N-type TFT 16 to operate, and a piezoelectric signal generated by the application of the pressure is correspondingly converted into a current signal. In this case, an electron carrier is formed at a position where the source (Source-1) and the drain (Drain-1) of the first TFT 15 are in contact with the carbon nanotube thin film layer. The electron barrier has a significant blocking effect for electrons, so that the electrons in the second electrode layer 12 cannot enter the carbon nanotube through the Source-1, and therefore the first TFT 15 is in a turn-off state at this time. Thus, the pressure externally applied in the horizontal direction can be sensed by the second TFT 16.

Figure 4:
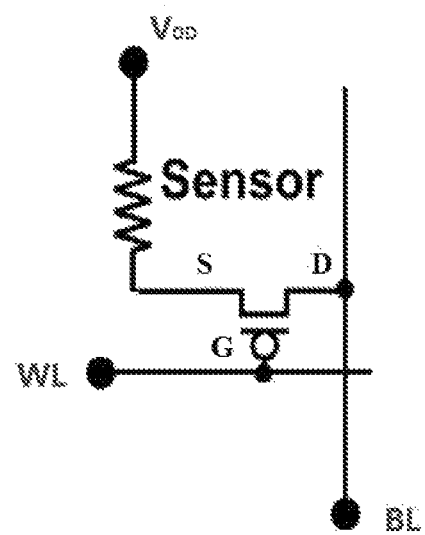
FIG. 4 is a structural diagram of elements of a piezoelectric sensor according to an embodiment of the present disclosure.

FIG. 4 is a structural diagram of elements of a piezoelectric sensor according to an embodiment of the present disclosure.

Sensor represents a conventional piezoelectric sensor consisting of a first electrode layer, a piezoelectric thin film layer, and a second electrode layer, and the sensor is connected to a source (S for short) of a TFT. When WL is at a high level, a storage unit connected to the WL is turned on, and data may be read from or written into the storage unit on BL.

Figure 5:
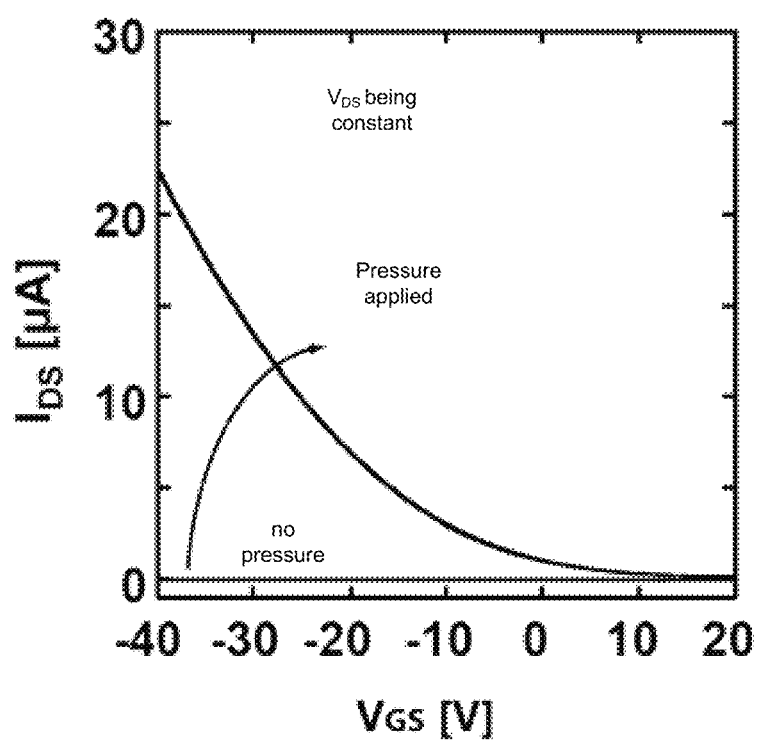
FIG. 5 is a diagram of an operating principle of detecting pressure sensing by a piezoelectric sensor according to an embodiment of the present disclosure.

FIG. 5 is a diagram of an operating principle of detecting pressure sensing by a piezoelectric sensor according to an embodiment of the present disclosure.

A horizontal axis represents a gate voltage (VGS), and a vertical axis represents source leakage current (IDS). It can be seen that IDS is 0 when no pressure is applied; and IDS is not 0 and varies with VGS when a pressure is applied in a direction.

It should be noted that FIG. 5 illustrates a diagram of an operating principle of turning on a P-type TFT in the piezoelectric sensor and detecting a pressure by the P-type TFT, an operating principle of turning on an N-type TFT in the piezoelectric sensor and detecting a pressure by the N-type TFT is similar to that of the P-type TFT and will not be repeated here.

The embodiments of the present disclosure further provide a method for manufacturing a piezoelectric sensor, comprising:

sequentially manufacturing a second electrode layer, a piezoelectric thin film layer and a first electrode layer on a substrate from bottom to up; and manufacturing a first functional module configured to sense a pressure in a first direction and a second functional module configured to sense a pressure in a second direction which are connected to the second electrode layer respectively on the substrate, the first direction and the second direction are perpendicular to each other.

The first direction may be, for example, a vertical direction, and the second direction may be, for example, a horizontal direction.

There is no strict requirement for orders of manufacturing the second electrode layer, the piezoelectric thin film layer and the first electrode layer on the substrate and manufacturing the first functional module and the second functional module. The first functional module and the second functional module may be manufactured after the second electrode layer, the piezoelectric thin film layer and the first electrode layer are manufactured, or the second electrode layer, the piezoelectric thin film layer and the first electrode layer may be manufactured after the first functional module and the second functional module are manufactured.

In an embodiment, the second electrode layer, the piezoelectric thin film layer and the first electrode layer are sequentially manufactured on the substrate from bottom to top using an electron beam thermal evaporation method.

In an embodiment, the first functional module comprises a first TFT, and the second functional module comprises a second TFT, and the step of manufacturing a first functional module configured to sense a pressure in a first direction and a second functional module configured to sense a pressure in a second direction which are connected to the second electrode layer respectively on the substrate further comprises:

manufacturing the first TFT on the substrate, manufacturing the second TFT on the substrate, electrically connecting a source of the first TFT to a first electrode contact terminal pre-provided on the second electrode layer, and electrically connecting a source of the second TFT to a second electrode contact terminal pre-provided on the second electrode layer, wherein the first TFT is a P-type TFT and the second TFT is an N-type TFT.

In an embodiment, a same layer of carbon nanotube thin film is shared by the first TFT and the second TFT as a conductive channel layer.

In an embodiment, the carbon nanotube thin film is manufactured using a solution approach, wherein the solution approach may be, for example, immersion, spin coating, ink jet printing etc.

In an embodiment, the source and a drain of the first TFT are manufactured using first metal, and the source and a drain of the second TFT are manufactured using second metal, wherein a work function of the first metal is greater than a work function of the second metal.

In an embodiment, the first metal is Pd, and the second metal is Sc.

In an embodiment, the first metal and the second metal are manufactured using an electron beam thermal evaporation method.

In an embodiment, a Gate Insulating (GI) layer is shared by the first TFT and the second TFT, and the gate insulating layer may be formed using a solution approach such as immersion, spin coating, ink jet printing etc.

In an embodiment, the substrate is a silk fibroin substrate, which is manufactured using a solution approach.

When the piezoelectric sensor is manufactured, all the patterning processes can be done by a photolithography process. When the various functional components are manufactured on the substrate, the substrate may be kept at a low temperature and thus may be compatible with the flexible process.

In an embodiment, the silk fibroin substrate is manufactured on solid Polydimethylsiloxane (PDMS) using a solution approach, and after the step of manufacturing the second electrode layer, the piezoelectric thin film layer, the first electrode layer, the first functional module and the second functional module on the silk fibroin substrate which manufactured on the PDMS, the method further comprises: peeling the PMDS off. In this way, a truly flexible medical-grade piezoelectric thin film sensor capable of omni-directional sensing and having high performance can be manufactured.

The piezoelectric sensor according to the embodiments of the present disclosure, as a flexible dynamic strain sensor, can be applied to fields such as medical treatment, automotive electronics, motion tracking systems etc., and is especially suitable for fields such as wearable equipment, medical monitoring and therapeutic use in vitro or in vivo, or electronic skin applied to artificial intelligence, etc.

It will be apparent to those skilled in the art that various changes and variations can be made in the present disclosure without departing from the spirit and scope of the present disclosure. In this way, the present disclosure is intended to embrace such changes and variations if the changes and variations of the present disclosure are within the scope of the claims of the present disclosure and the equivalents thereof.

I claim:

1. A piezoelectric sensor, comprising a first electrode layer, a second electrode layer and a piezoelectric thin film layer between the first electrode layer and the second electrode layer, the piezoelectric sensor further comprising:
a first functional module and a second functional module, both of which are connected to the second electrode layer, wherein the first functional module is configured to sense a pressure applied to the piezoelectric sensor in a first direction, and the second functional module is configured to sense a pressure applied to the piezoelectric sensor in a second direction, and the first direction and the second direction are perpendicular to each other.

2. The piezoelectric sensor according to claim 1, wherein the first functional module comprises a first Thin Film Transistor (TFT) having a source connected to a first electrode contact terminal of the second electrode layer, a drain connected to a first data line and a gate connected to a first gate line; and
the second functional module comprises a second TFT having a source connected to a second electrode contact terminal of the second electrode layer, a drain connected to a second data line and a gate connected to a second gate line,
wherein the first TFT is a P-type TFT, and the second TFT is an N-type TFT.

3. The piezoelectric sensor according to claim 2, wherein the first TFT and the second TFT share a same layer of carbon nanotube thin film as a conductive channel layer.

4. The piezoelectric sensor according to claim 3, wherein a work function of a first metal forming the source and the drain of the first TFT is greater than a work function of a second metal forming the source and the drain of the second TFT.

5. The piezoelectric sensor according to claim 4, wherein the source and the drain of the first TFT and the source and the drain of the second TFT are in contact with the carbon nanotube thin film;
a gap between the Fermi energy level of the first metal and a valence band of the carbon nanotube thin film is less than a gap between the Fermi energy level of the first metal and a conduction band of the carbon nanotube thin film; and
a gap between the Fermi energy level of the second metal and a conduction band of the carbon nanotube thin film is less than a gap between the Fermi energy level of the second metal and a valence band of the carbon nanotube thin film.

6. The piezoelectric sensor according to claim 5, wherein the first metal is Pd and the second metal is Sc.

7. The piezoelectric sensor according to claim 6, wherein the source and the drain of the first TFT is further formed by metal Ti on a bottom of the first metal Pd.

8. The piezoelectric sensor according to claim 7, wherein the metal Ti has a thickness ranging from 0.2 nm to 0.8 nm.

9. The piezoelectric sensor according to claim 1, wherein the piezoelectric thin film layer accumulates positive charges on the second electrode layer when the piezoelectric sensor is applied with the pressure in the first direction, and accumulates negative charges on the second electrode layer when the piezoelectric sensor is applied with the pressure in the second direction.

10. The piezoelectric sensor according to claim 1, wherein the piezoelectric sensor further comprises a silk fibroin substrate, on which all of the second electrode layer, the first functional module and the second functional module are manufactured.

11. A method for manufacturing the piezoelectric sensor according to any of claim 1, comprising:
sequentially manufacturing the second electrode layer, the piezoelectric thin film layer and the first electrode layer on the substrate from bottom to top; and
manufacturing the first functional module and the second functional module on the substrate, wherein both of the first functional module and the second functional module are manufactured to be connected to the second electrode layer, the first functional module is configured to sense the pressure applied to the piezoelectric sensor in the first direction, the second functional module is configured to sense the pressure applied to the piezoelectric sensor in the second direction, and the first direction and the second direction are perpendicular to each other.

12. The method according to claim 11, wherein the second electrode layer, the piezoelectric thin film layer and the first electrode layer are sequentially manufactured on the substrate from bottom to top using an electron beam thermal evaporation method.

13. The method according to claim 11, wherein the first functional module comprises a first Thin Film Transistor (TFT), and the second functional module comprises a second TFT, and
the step of manufacturing the first functional module and the second functional module on the substrate further comprises:
manufacturing the first TFT on the substrate,
manufacturing the second TFT on the substrate,
electrically connecting a source of the first TFT to a first electrode contact terminal pre-provided on the second electrode layer, and
electrically connecting a source of the second TFT to a second electrode contact terminal pre-provided on the second electrode layer,
wherein the first TFT is a P-type TFT and the second TFT is an N-type TFT.

14. The method according to claim 13, wherein in the step of manufacturing the first functional module and the second functional module on the substrate, a carbon nanotube thin film in the conductive channel layer shared by the first TFT and the second TFT is manufactured using a solution approach.

15. The method according to claim 13, wherein in the step of manufacturing the first functional module and the second functional module on the substrate, the source and a drain of the first TFT are manufactured using a first metal, and the source and a drain of the second TFT are manufactured using a second metal, wherein both of the first metal and the second metal are manufactured using an electron beam thermal evaporation method.

16. The method according to claim 11, wherein before the step of manufacturing the second electrode layer, the piezoelectric thin film layer and the first electrode layer, the method further comprises:
manufacturing a silk fibroin substrate using a solution approach.

17. The method according to claim 16, wherein the silk fibroin substrate is manufactured on solid Polydimethylsiloxane (PDMS) using a solution approach, and after the step of manufacturing the first functional module and the second functional module, the method further comprises:
peeling the PMDS off.

18. A method for manufacturing the piezoelectric sensor according to claim 2, comprising:
sequentially manufacturing the second electrode layer, the piezoelectric thin film layer and the first electrode layer on the substrate from bottom to top; and
manufacturing the first functional module and the second functional module on the substrate, wherein both of the first functional module and the second functional module are manufactured to be connected to the second electrode layer, the first functional module is configured to sense the pressure applied to the piezoelectric sensor in the first direction, the second functional module is configured to sense the pressure applied to the piezoelectric sensor in the second direction, and the first direction and the second direction are perpendicular to each other.

19. The method according to claim 18, wherein the second electrode layer, the piezoelectric thin film layer and the first electrode layer are sequentially manufactured on the substrate from bottom to top using an electron beam thermal evaporation method.

20. The method according to claim 18, wherein the first functional module comprises the first Thin Film Transistor (TFT), and the second functional module comprises the second TFT, and
the step of manufacturing the first functional module and the second functional module on the substrate further comprises:
manufacturing the first TFT on the substrate,
manufacturing the second TFT on the substrate,
electrically connecting the source of the first TFT to the first electrode contact thermal pre-provided on the second electrode layer, and
electrically connecting the source of the second TFT to the second electrode contact thermal pre-provided on the second electrode layer,
wherein the first TFT is a P-type TFT and the second TFT is an N-type TFT.

* * * * *